US009305499B2

(12) United States Patent
Huang

(10) Patent No.: US 9,305,499 B2
(45) Date of Patent: Apr. 5, 2016

(54) DRIVING APPARATUS, DRIVING APPARATUS OPERATING METHOD, AND SELF-JUDGEMENT SLEW RATE ENHANCING AMPLIFIER

(71) Applicant: Raydium Semiconductor Corporation, Hsinchu (TW)

(72) Inventor: Chih Chuan Huang, Kaohsiung (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 52 days.

(21) Appl. No.: 13/872,702

(22) Filed: Apr. 29, 2013

(65) Prior Publication Data

US 2013/0286002 A1 Oct. 31, 2013

(30) Foreign Application Priority Data

Apr. 27, 2012 (TW) ............................ 101115195 A

(51) Int. Cl.
*G09G 3/36* (2006.01)
*H03F 3/45* (2006.01)
*H04N 5/68* (2006.01)

(52) U.S. Cl.
CPC ............ *G09G 3/3611* (2013.01); *G09G 3/3688* (2013.01); *G09G 2310/0291* (2013.01); *G09G 2320/0252* (2013.01); *G09G 2340/16* (2013.01)

(58) Field of Classification Search
USPC .................................................... 345/87, 100
See application file for complete search history.

(56) References Cited

U.S. PATENT DOCUMENTS

2004/0036670 A1* 2/2004 Chung ............................ 345/99
2006/0279356 A1* 12/2006 An ...................... H03F 3/45219 330/253
2008/0266276 A1* 10/2008 Choi et al. .................... 345/204

* cited by examiner

*Primary Examiner* — Grant Sitta

(57) ABSTRACT

A driving apparatus applied in a liquid crystal display is disclosed. The driving apparatus at least includes a first latch, a second latch, an output buffer, and a slew rate enhancing module. The first latch is used to store a second data signal. The second latch is used to store a first data signal. The first data signal is previous to the second data signal. The slew rate enhancing module is used to compare the first data signal and the second data signal to generate a compared result, and correspondingly output a control signal to the output buffer according to the compared result to control a driving current of the output buffer.

2 Claims, 4 Drawing Sheets

DRIVING APPARATUS, DRIVING APPARATUS OPERATING METHOD, AND SELF-JUDGEMENT SLEW RATE ENHANCING AMPLIFIER

BACKGROUND OF THE INVENTION

1. Field of the Invention

The invention relates to a liquid crystal display; in particular, to a driving apparatus, a driving apparatus operating method, and a self-judgment slew rate enhancing amplifier applied in the liquid crystal display.

2. Description of the Related Art

In recent years, with the development of display technology, various novel types of display apparatus having different functions and advantages are shown in the market to replace the conventional cathode ray tube (CRT) monitor. Among them, the liquid crystal display (LCD) having advantages of saving power and small size is very popular and becomes a mainstream of the display market.

In general, the driving circuit in the LCD includes a timing controller (TCON), a source driver, and a gate driver. The timing controller is a control IC used for generating and outputting a control timing to control the timings of the source driver and the gate driver of the LCD panel.

Please refer to FIG. 1. FIG. 1 shows a conventional source driver. As shown in FIG. 1, the source driver 1 includes first latches 10*a* and 10*b*, second latches 12*a* and 12*b*, level shifters 14*a* and 14*b*, a N-type digital-analog converter 16*a*, a P-type digital-analog converter 16*b*, an exchanging switch 18, output buffers 19*a* and 19*b*, and output pads 20*a* and 20*b*. After a timing controller (not shown in FIG. 1) transmits digital input data to the source driver 1, the digital input data will be orderly stored in the first latches 10*a* and 10*b* corresponding to the first channel and the second channel respectively. When a STB signal is received, the digital input data will be stored in the second latches 12*a* and 12*b* respectively. Then, the digital input data with low level will be converted into the digital input data with high level by the level shifters 14*a* and 14*b* respectively, and then converted into analog input data by the N-type digital-analog converter 16*a* and the P-type digital-analog converter 16*b* respectively. Then, the exchanging switch 18 will selectively transmit the analog voltage to the output buffer 19*a* and 19*b* respectively and output the analog voltage to a display panel (not shown in FIG. 1) through the output pads 20*a* and 20*b* respectively to drive pixels on the display panel.

It should be noticed that the slew rate is defined as the rising or the falling of voltage in 1 msec. As to square wave, the conversion time needed for the output voltage to rise from wave trough to wave crest or fall from wave crest to wave trough is determined by the output current and the conversion voltage of the output voltage between the wave crest and wave trough. Every time when the digital input data that the timing controller inputs into the source driver 1 is changed, the analog voltage that the source driver 1 outputs to the display panel will be changed correspondingly. Different output voltage differences will make the output converting time also different. This will result in different voltage converting rates and affect the charging/discharging time of the panel pixels and limit its reaction time, so that the display quality of the display panel will be seriously damaged. Therefore, the above-mentioned problems occurred in the prior arts should be solved.

SUMMARY OF THE INVENTION

Therefore, the invention provides a driving apparatus, a driving apparatus operating method, and a self-judgment slew rate enhancing amplifier applied in the liquid crystal display to solve the above-mentioned problems occurred in the prior arts.

An embodiment of the invention is a driving apparatus. In this embodiment, the driving apparatus is applied to a liquid crystal display. The driving apparatus includes a first latch, a second latch, an output buffer, and a slew rate enhancing module. The first latch is used for storing a second data signal. The second latch is coupled to the first latch and used for storing a first data signal, wherein the first data signal is previous to the second data signal. The slew rate enhancing module is coupled to the first latch, the second latch, and the output buffer respectively and used for comparing the first data signal and the second data signal to generate a compared result and correspondingly output a control signal to the output buffer according to the compared result to control a driving current of the output buffer.

In an embodiment, the slew rate enhancing module includes a comparing unit and a level shifting unit. The comparing unit has two input terminals and an output terminal. The two input terminals are coupled to the first latch and the second latch respectively and receive the second data signal and the first data signal. The comparing unit compares the first data signal and the second data signal to generate the compared result and the output terminal outputs the compared result. The level shifting unit is coupled to the output terminal of the comparing unit and the output buffer. The level shifting unit correspondingly converts the compared result with low level into the control signal with high level and outputs the control signal to the output buffer.

In an embodiment, the comparing unit is a logical judgment circuit.

In an embodiment, the driving apparatus further includes a level shifter and a digital-analog converter. The level shifter is coupled to the second latch and used for converting the first data signal and the second data signal from low level to high level respectively. The digital-analog converter is coupled to the level shifter and used for converting the first data signal and the second data signal from digital voltage to analog voltage respectively.

In an embodiment, the digital-analog converter is an N-type digital-analog converter or a P-type digital-analog converter used for outputting a negative analog voltage or a positive analog voltage.

In an embodiment, the driving apparatus further includes an exchanging switch coupled between the digital-analog converter and the output buffer. The exchanging switch is used for selectively transmitting the negative analog voltage or the positive analog voltage outputted by the digital-analog converter to the output buffer.

Another embodiment of the invention is a driving apparatus operating method. In this embodiment, the driving apparatus operating method is used for operating a driving apparatus applied to a liquid crystal display. The driving apparatus includes a first latch, a second latch, and an output buffer. A first data signal stored in the second latch is previous to a second data signal stored in the first latch. The method includes steps of: (a) comparing the first data signal with the second data signal to generate a compared result; (b) correspondingly output a control signal to the output buffer according to the compared result to dynamically adjust a driving current of the output buffer.

Another embodiment of the invention is a self-judgment slew rate enhancing amplifier. The self-judgment slew rate enhancing amplifier is applied to a driving apparatus of a liquid crystal display. The driving apparatus includes a first latch, a second latch, and an output buffer. The self-judgment slew rate enhancing amplifier includes two input terminals, a comparing unit, and an output terminal. The two input terminals is coupled to the first latch and the second latch respectively and receive the second data signal and the first data signal from the first latch and the second latch respectively. The comparing unit is coupled to the two input terminals and used for comparing the first data signal and the second data signal to generate a compared result. The output terminal is coupled to the comparing unit and used for outputting the compared result.

Compared to the prior art, the driving apparatus of the invention compares the current data and the previous data stored in the first latch and the second latch respectively to generate a compared result, and then correspondingly controls the driving current of the output buffer according to the compared result. With appropriate design, all voltage conversions under different conditions can be adjusted to have the same rate to keep the same slew rate of the source driver to further maintain the display quality of the display panel.

The advantage and spirit of the invention may be understood by the following detailed descriptions together with the appended drawings.

DETAILED DESCRIPTION

Figure 2:
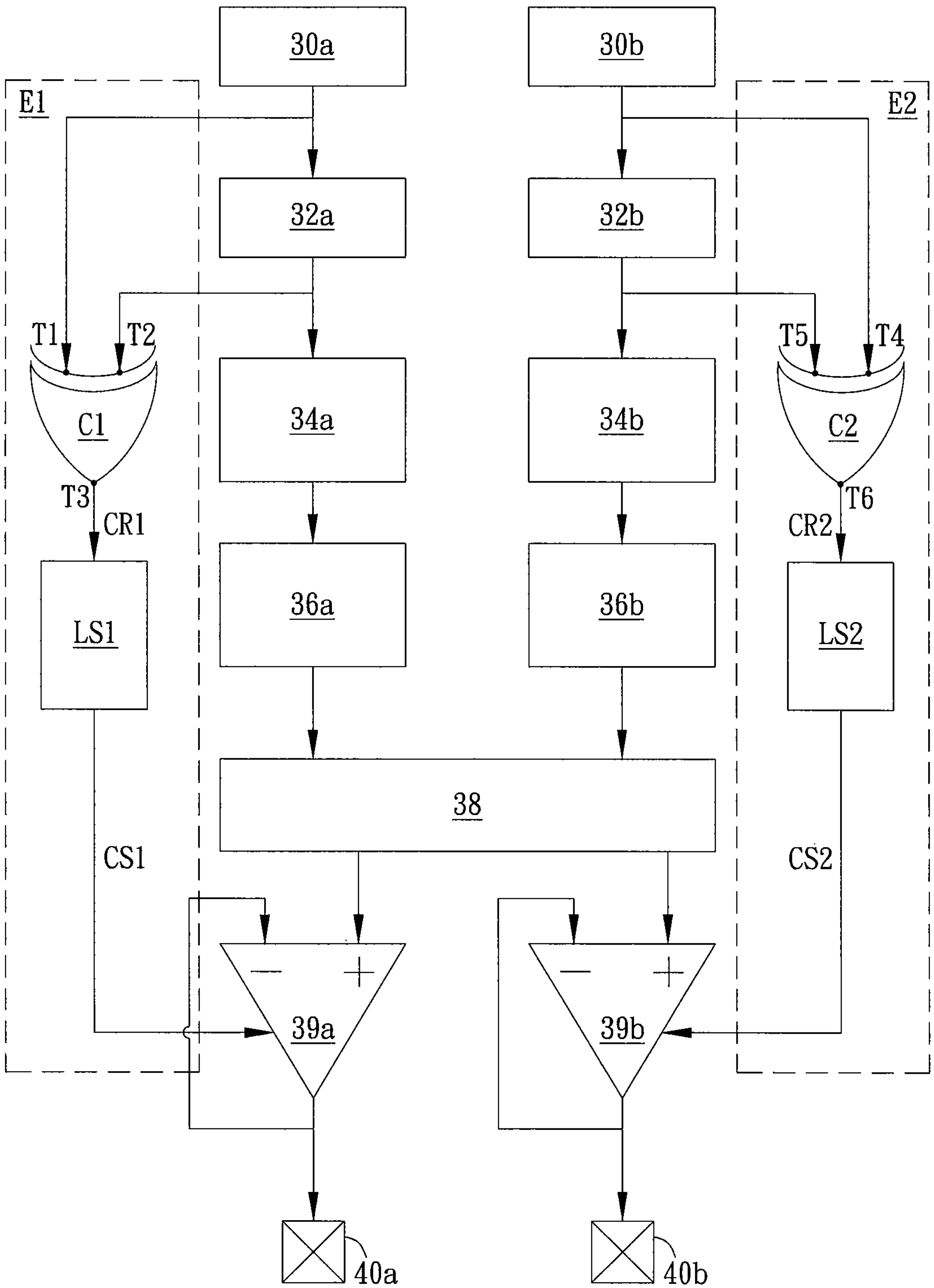
FIG. 2 illustrates a function block diagram of the driving apparatus in an embodiment of the invention.

An embodiment of the invention is a driving apparatus. In this embodiment, the driving apparatus can be a source driver applied in a liquid crystal display, but not limited to this. Please refer to FIG. 2. FIG. 2 illustrates a function block diagram of the driving apparatus in this embodiment.

As shown in FIG. 2, the driving apparatus 3 includes first latches 30*a* and 30*b*, second latches 32*a* and 32*b*, level shifters 34*a* and 34*b*, a N-type digital-analog converter 36*a*, a P-type digital-analog converter 36*b*, an exchanging switch 38, output buffers 39*a* and 39*b*, output pads 40*a* and 40*b*, and slew rate enhancing modules E1 and E2. The slew rate enhancing module E1 includes a comparing unit C1 and a level shifting unit LS1; the slew rate enhancing module E2 includes a comparing unit C2 and a level shifting unit LS2. In fact, the comparing units C1 and C2 can be a logical judgment circuit, for example, an exclusive-OR gate (XOR gate) or an inverse of the XOR gate (XNOR gate), but not limited to this.

The first latch 30*a*, the second latch 32*a*, the level shifter 34*a*, and the N-type digital-analog converter 36*a* are belong to a first channel; the first latch 30*b*, the second latch 32*b*, the level shifter 34*b*, and the P-type digital-analog converter 36*b* are belong to a second channel. Wherein, the first channel and the second channel are adjacent channels.

The first latch 30*a* is coupled to the second latch 32*a*; the second latch 32*a* is coupled to the level shifter 34*a*; the level shifter 34*a* is coupled to the N-type digital-analog converter 36*a*; the N-type digital-analog converter 36*a* is coupled to the exchanging switch 38; the exchanging switch 38 is coupled to the output buffers 39*a* and 39*b*; the output buffer 39*a* is coupled to the output pad 40*a*. The comparing unit C1 of the slew rate enhancing module E1 has two input terminals T1 and T2 and an output terminal T3, wherein the two input terminals T1 and T2 are coupled to the first latch 30*a* and the second latch 32*a* respectively, and the output terminal T3 is coupled to the level shifting unit LS1. The level shifting unit LS1 is coupled to the output buffers 39*a*.

The first latch 30*b* is coupled to the second latch 32*b*; the second latch 32*b* is coupled to the level shifter 34*b*; the level shifter 34*b* is coupled to the P-type digital-analog converter 36*b*; the P-type digital-analog converter 36*b* is coupled to the exchanging switch 38; the exchanging switch 38 is coupled to the output buffers 39*a* and 39*b*; the output buffer 39*b* is coupled to the output pad 40*b*. The comparing unit C2 of the slew rate enhancing module E2 has two input terminals T4 and T5 and an output terminal T6, wherein the two input terminals T4 and T5 are coupled to the first latch 30*b* and the second latch 32*b* respectively, and the output terminal T6 is coupled to the level shifting unit LS2. The level shifting unit LS2 is coupled to the output buffers 39*b*.

Figure 1:
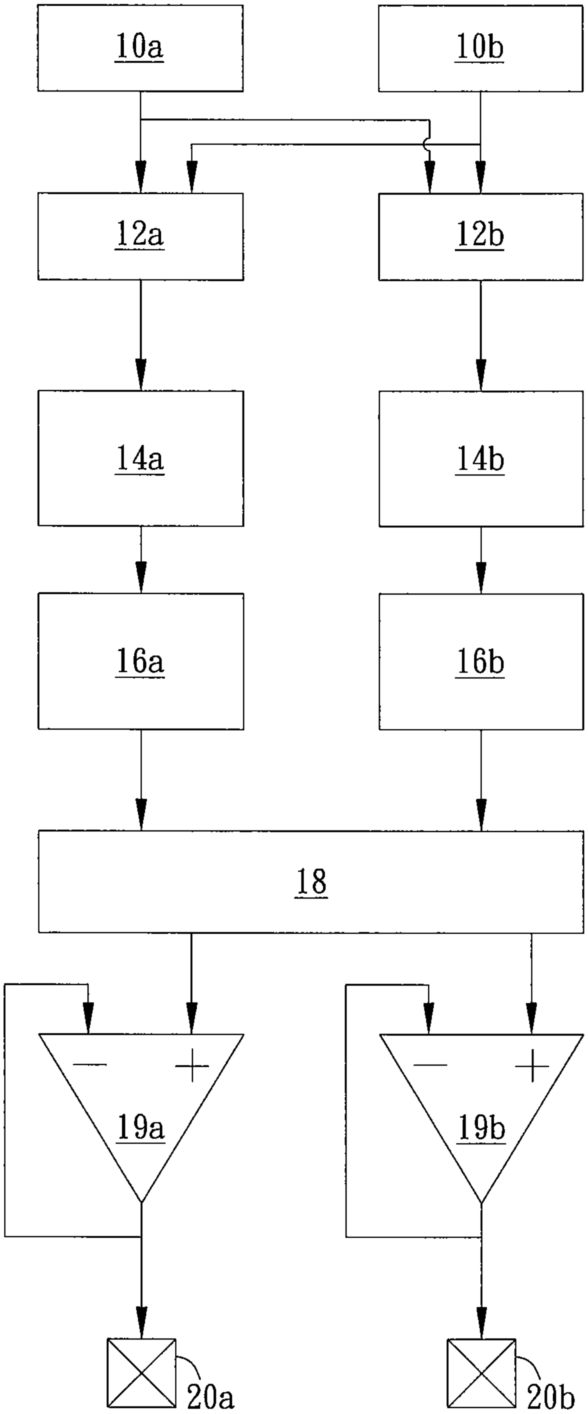
FIG. 1 (PRIOR ART)
FIG. 1 illustrates a schematic diagram of the conventional source driver.

In this embodiment, after a timing controller (not shown in FIG. 1) transmits digital input data to the source driver 3, the digital input data will be orderly stored in the first latches 30*a* and 30*b* corresponding to the first channel and the second channel respectively. When a STB signal is received, the digital input data will be stored in the second latches 32*a* and 32*b* respectively. Then, the digital input data with low level will be converted into the digital input data with high level by the level shifters 34*a* and 34*b* respectively, and then the digital input data (voltage) is converted into analog input data (voltage) by the N-type digital-analog converter 36*a* and the P-type digital-analog converter 36*b* respectively. Then, the exchanging switch 38 will selectively transmit the analog voltage to the output buffers 39*a* or 39*b* respectively and output the analog voltage to a display panel (not shown in FIG. 2) through the output pads 40*a* and 40*b* respectively to drive pixels on the display panel.

It is assumed that the data signals stored in the first latch 30*a* and the second latch 32*a* corresponding to the first channel are a first data signal and a second data signal respectively, and the first data signal is previous to the second data signal. That is to say, if the second data signal is a current data signal, the first data signal will be a previous data signal.

It should be noticed that the two input terminals T1 and T2 of the comparing unit C1 of the slew rate enhancing module E1 will receive the first data signal and the second data signal from the first latch 30*a* and the second latch 32*a* respectively, and then the comparing unit C1 will compare the first data signal and the second data signal to generate a compared result CR1, and the output terminal T3 will output the compared result CR1 to the level shifting unit LS1. In fact, the comparing unit C1 can do a subtraction on the first data signal and the second data signal to obtain the compared result CR1, but not limited to this.

For example, if the first data signal (previous data signal) stored in the first latch 30*a* is 0000_0000 and the second data signal (current data signal) stored in the second latch 32*b* is 1111_0000, the comparing unit C1 can subtract the first data signal (previous data signal) from the second data signal (current data signal) to obtain the compared result CR1 of 1111_0000.

After the level shifting unit LS1 receives the compared result CR1 from the comparing unit C1, the level shifting unit LS1 will correspondingly convert the low-level compared result CR1 into a high-level control signal CS1, and output the control signal CS1 to the output buffer 39*a* to control the driving current of the output buffers 39*a*. For example, if the compared result CR1 is 0, it means that the second data signal (current data signal) is equivalent to the first data signal (previous data signal). Therefore, it is unnecessary to adjust the driving current of the output buffer 39*a* to keep the same slew rate.

Similarly, it is assumed that the data signals stored in the first latch 30*b* and the second latch 32*b* corresponding to the second channel are a third data signal and a fourth data signal respectively, and the third data signal is previous to the fourth data signal. That is to say, if the fourth data signal is a current data signal, the third data signal will be a previous data signal. The two input terminals T4 and T5 of the comparing unit C2 of the slew rate enhancing module E2 will receive the third data signal and the fourth data signal from the first latch 30*b* and the second latch 32*b* respectively, and then the comparing unit C2 will compare the third data signal and the fourth data signal to generate a compared result CR2, and the output terminal T6 will output the compared result CR2 to the level shifting unit LS2. In fact, the comparing unit C2 can do a subtraction on the third data signal and the fourth data signal to obtain the compared result CR2, but not limited to this. After the level shifting unit LS2 receives the compared result CR2 from the comparing unit C2, the level shifting unit LS2 will correspondingly convert the low-level compared result CR2 into a high-level control signal CS2, and output the control signal CS2 to the output buffer 39*b* to control the driving current of the output buffers 39*b*.

Figure 3:
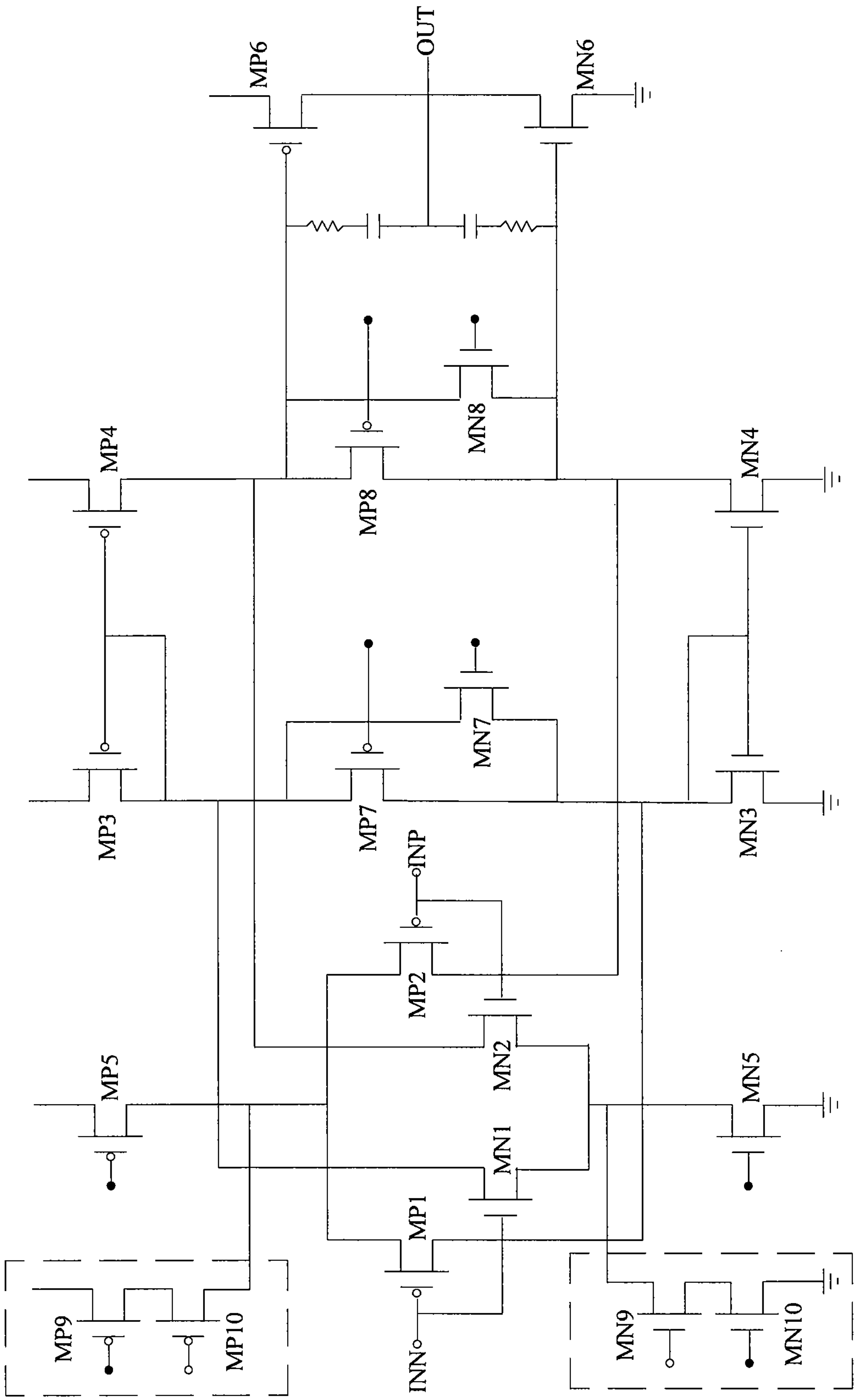
FIG. 3 illustrates an embodiment of the slew rate enhancing circuit.

Please refer to FIG. 3. FIG. 3 shows an embodiment of the slew rate enhancing circuit. As shown in FIG. 3, the slew rate enhancing circuit includes P-type transistor switches MP1~MP10, N-type transistor switches MN1~MN10, an output terminal INN and INP, and an output terminal OUT. After the compared voltage signal is inputted into the slew rate enhancing circuit, the slew rate enhancing circuit will correspondingly control the driving current according to the compared voltage signal to increase the slew rate. When the conversion voltage of the output voltage between the wave crest and wave trough is large, the slew rate enhancing circuit can be used to reduce the conversion time needed for the output voltage to rise from wave trough to wave crest or fall from wave crest to wave trough, so that the slew rate can be keep the same without any variation under different conditions.

Another embodiment of the invention is a self-judgment slew rate enhancing amplifier. In this embodiment, the self-judgment slew rate enhancing amplifier is applied to a driving apparatus of a liquid crystal display. The driving apparatus includes a first latch, a second latch, and an output buffer. The self-judgment slew rate enhancing amplifier includes two input terminals, a comparing unit, and an output terminal. The two input terminals is coupled to the first latch and the second latch respectively and receive the second data signal and the first data signal from the first latch and the second latch respectively. The comparing unit is coupled to the two input terminals and used for comparing the first data signal and the second data signal to generate a compared result. The output terminal is coupled to the comparing unit and used for outputting the compared result. Since the self-judgment slew rate enhancing amplifier is disclosed in the above-mentioned embodiments, it is not mentioned again.

Figure 4:
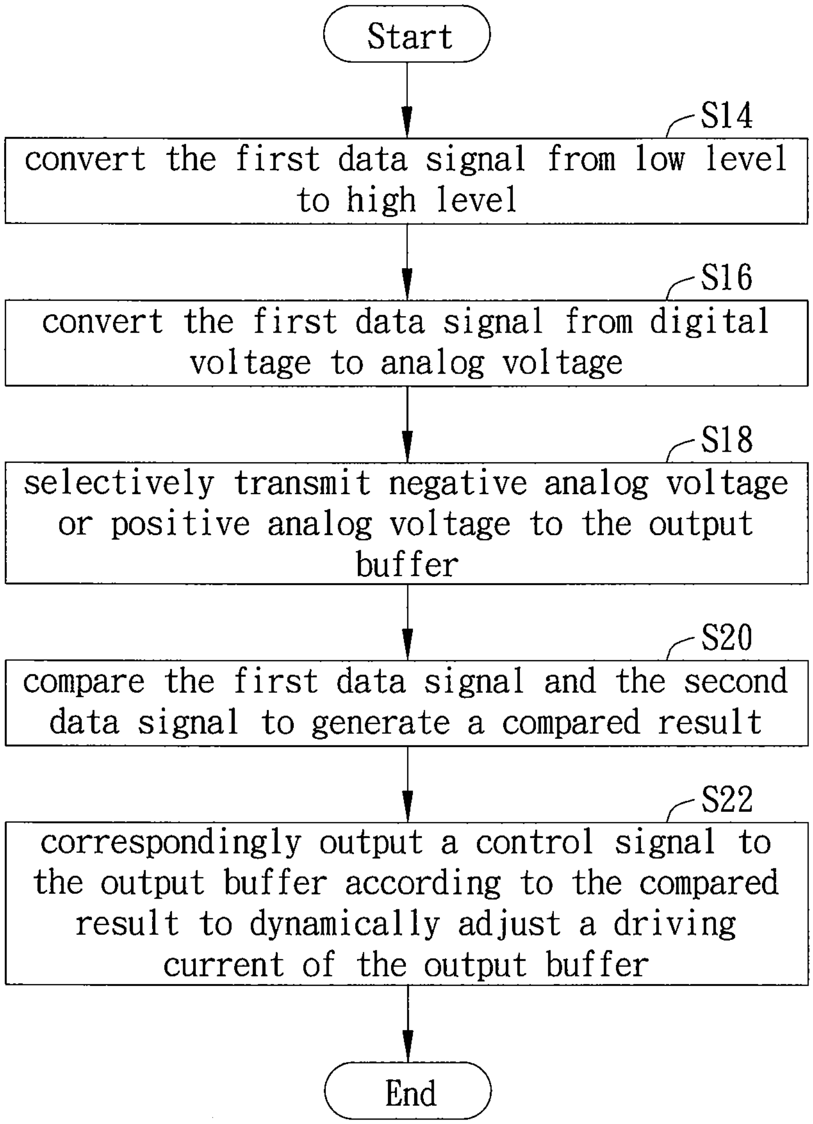
FIG. 4 illustrates a flow chart of the driving apparatus operating method in another embodiment of the invention.

Another embodiment of the invention is a driving apparatus operating method. In this embodiment, the driving apparatus operating method is used for operating a driving apparatus applied to a liquid crystal display. The driving apparatus includes a first latch, a second latch, and an output buffer. A first data signal stored in the second latch is previous to a second data signal stored in the first latch. Please refer to FIG. 4. FIG. 4 illustrates a flow chart of the driving apparatus operating method in another embodiment of the invention.

As shown in FIG. 4, in the step S14, the method converts the first data signal from low level to high level. In the step S16, the method converts the first data signal from digital voltage to analog voltage (negative analog voltage or positive analog voltage). In the step S18, the method selectively transmits negative analog voltage or positive analog voltage to the output buffer. In fact, the step S14 will also convert the second data signal from low level to high level. The step S16 will also convert the second data signal from digital voltage to analog voltage (negative analog voltage or positive analog voltage).

In the step S20, the method compares the first data signal and the second data signal to generate a compared result. In the step S22, the method correspondingly outputs a control signal to the output buffer according to the compared result to dynamically adjust a driving current of the output buffer. In fact, the step S22 correspondingly converts the low-level compared result into the high-level compared result and outputs it to the output buffer.

Compared to the prior art, the driving apparatus of the invention compares the current data and the previous data stored in the first latch and the second latch respectively to generate a compared result, and then correspondingly controls the driving current of the output buffer according to the compared result. With appropriate design, all voltage conversions under different conditions can be adjusted to have the same rate to keep the same slew rate of the source driver to further maintain the display quality of the display panel.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A self-judgment slew rate enhancing amplifier, applied to a driving apparatus of a liquid crystal display, the driving apparatus comprising a first latch, a second latch, and an output buffer, the self-judgment slew rate enhancing amplifier comprising:

10 P-type transistor switches;

10 N-type transistor switches;

two input terminals, coupled to the first latch and the second latch respectively and receiving the second data signal and the first data signal from the first latch and the second latch respectively;

a comparing unit, coupled to the two input terminals, for comparing the first data signal and the second data signal to generate a compared result; and an output terminal, coupled to the comparing unit, for outputting the compared result;

wherein the driving apparatus further comprises a level shifting unit coupling to the output terminal and the output buffer, the level shifting unit correspondingly converts the compared result with low level into the control signal with high level and outputs the control signal to the output buffer according to the compared result to control a driving current of the output buffer to increase a slew rate.

2. The self-judgment slew rate enhancing amplifier of claim 1, wherein the comparing unit is a logical judgment circuit.

* * * * *